United States Patent
Rice et al.

(10) Patent No.: US 8,432,609 B2
(45) Date of Patent: Apr. 30, 2013

(54) PHOTO-PUMPED SEMICONDUCTOR OPTICAL AMPLIFIER

(75) Inventors: Robert Rex Rice, Simi Valley, CA (US); Derek Evan Schulte, Playa Del Rey, CA (US); Elizabeth Twyford Kunkee, Manhattan Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 601 days.

(21) Appl. No.: 12/690,539

(22) Filed: Jan. 20, 2010

(65) Prior Publication Data

US 2011/0176204 A1    Jul. 21, 2011

(51) Int. Cl.
*H01S 5/00* (2006.01)
*H01S 3/05* (2006.01)

(52) U.S. Cl.
USPC .......................... 359/344; 359/346; 359/347

(58) Field of Classification Search .............. 359/344, 359/346, 347
See application file for complete search history.

(56) References Cited

U.S. PATENT DOCUMENTS

| | | | |
|---|---|---|---|
| 3,982,201 A * | 9/1976 | Rosenkrantz et al. | 372/75 |
| 5,131,002 A * | 7/1992 | Mooradian | 372/50.12 |
| 5,596,436 A * | 1/1997 | Sargis et al. | 398/76 |
| 6,014,391 A | 1/2000 | Byren | |
| 6,556,610 B1 | 4/2003 | Jiang et al. | |
| 6,643,305 B2 | 11/2003 | Bewley et al. | |
| 6,658,034 B2 | 12/2003 | Garnache et al. | |
| 6,734,043 B2 | 5/2004 | Bewley et al. | |
| 6,744,805 B2 | 6/2004 | Wang et al. | |
| 6,891,878 B2 * | 5/2005 | Spariosu et al. | 372/70 |
| 6,950,454 B2 | 9/2005 | Kruschwitz et al. | |
| 6,987,789 B2 * | 1/2006 | Bruesselbach et al. | 372/70 |
| 7,136,408 B2 | 11/2006 | Spinelli et al. | |
| 7,300,808 B2 | 11/2007 | Albrecht et al. | |
| 7,379,488 B2 | 5/2008 | Kim | |
| 7,388,895 B2 * | 6/2008 | Gong et al. | 372/66 |
| 7,406,108 B2 | 7/2008 | Lee et al. | |
| 7,486,714 B2 | 2/2009 | Lee | |
| 8,125,706 B2 * | 2/2012 | Vurgaftman et al. | 359/344 |
| 2002/0105997 A1 * | 8/2002 | Zhang | 372/70 |
| 2003/0012246 A1 * | 1/2003 | Klimek et al. | 372/70 |
| 2004/0233961 A1 | 11/2004 | Lutgen | |
| 2006/0274807 A1 | 12/2006 | Cho et al. | |
| 2007/0053397 A1 * | 3/2007 | Burckel et al. | 372/43.01 |
| 2007/0133640 A1 | 6/2007 | Kim | |
| 2007/0297469 A1 | 12/2007 | Brown | |
| 2008/0117946 A1 | 5/2008 | Kim | |
| 2011/0002355 A1 * | 1/2011 | Jansen | 372/50.11 |

* cited by examiner

*Primary Examiner* — Eric Bolda
(74) *Attorney, Agent, or Firm* — John A. Miller; Miller IP Group, PLC

(57) ABSTRACT

An edge photo-pumped semiconductor slab amplifier including an undoped semiconductor slab. A first gain structure is formed on an upper surface of the slab and a second gain structure is formed on a lower surface of the slab. The gain structures can be resonant periodic gain structures including a plurality of stacked quantum well layers. Confining layers are coupled to the gain structures to confine a signal beam within the semiconductor slab. Heat sinks are thermally coupled to the confining layers. Optical pump sources are provided along the side edges or coupled to the end edges of the slab so that pump light is introduced into the slab through the edges to provide gain for the quantum well layers.

20 Claims, 2 Drawing Sheets

PHOTO-PUMPED SEMICONDUCTOR OPTICAL AMPLIFIER

BACKGROUND

1. Field of the Disclosure

This disclosure relates generally to a semiconductor optical amplifier and, more particularly, to a semiconductor slab optical amplifier that includes gain layers at upper and lower surfaces of the slab and includes edge photo-pumping along the length of one or more of the four side surfaces of the slab.

2. Discussion of the Related Art

A semiconductor gain medium may be the most efficient optical medium known. Electrically pumped diode lasers have achieved an electrical-to-optical efficiency as high as 73% at room temperature and above 85% at 80K. In addition, semiconductor lasers can be photo-pumped using other lasers, where the benefit includes using low brightness pump power to achieve high brightness output beams. This is in contrast to solid lasers, such as YAG lasers, whose efficiency is typically in the region of 10-30%.

One known photo-pumped laser is a vertical cavity surface emitting laser (VCSEL). When a VCSEL is pumped by electrical injection, it is limited in output power to less than 1 watt. However, photo-pumped VCSELs have been shown to provide beam output power at about 20 watts. A typical VCSEL includes a resonate periodic gain (RPG) structure in which quantum wells (QW) are positioned at the anti-nodes (maxima) of a standing wave pattern in the VCSEL that is formed when forward and backward laser beams overlap as is typically done in an optical resonator or slab amplifier. These RPG structures can provide enhanced gain for the signal wavelength when photo-pumped at a wavelength absorbed by the quantum wells or the surrounding barrier material.

DETAILED DESCRIPTION OF THE EMBODIMENTS

The following discussion of the embodiments of the disclosure directed to a photo-pumped semiconductor slab optical amplifier is merely exemplary in nature, and is in no way intended to limit the disclosure or its applications or uses.

A scalable semiconductor waveguide amplifier has been proposed that is a photo-pumped semiconductor amplifier. This amplifier is pumped from the surface, but the laser action is parallel to the surface in a high order multi-mode waveguide. A diffraction limited beam incident at the input facet is periodically replicated at the Talbot self-imaging lengths in the waveguide with gain. The power limitation was set by thermal load, facet aperture and pump-like concentration. In this design, the experimental waveguide thickness was chosen to be 10 μm with ten evenly spaced quantum wells designed for about 1064-1080 nm operation with a pump wavelength of about 975 nm. These design choices were made because pumps and master oscillator sources were available and compatible with the GaAs/GaInAs growth technology that is optimum for this wavelength region. The absorption of the material comprising the quantum wells, while quite high per centimeter, did not absorb much of the vertically incident pump light because the quantum wells were only 10 nm thick.

Figure 1:
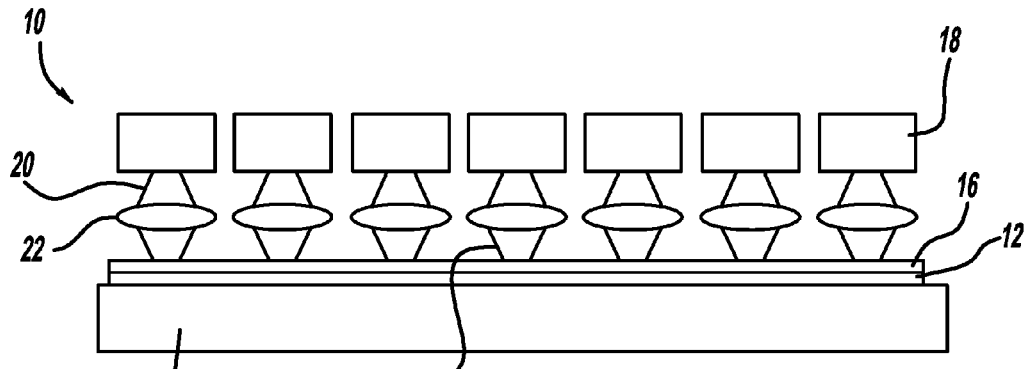
FIG. 1 is a side view of a scalable semiconductor waveguide amplifier.
Figure 2:
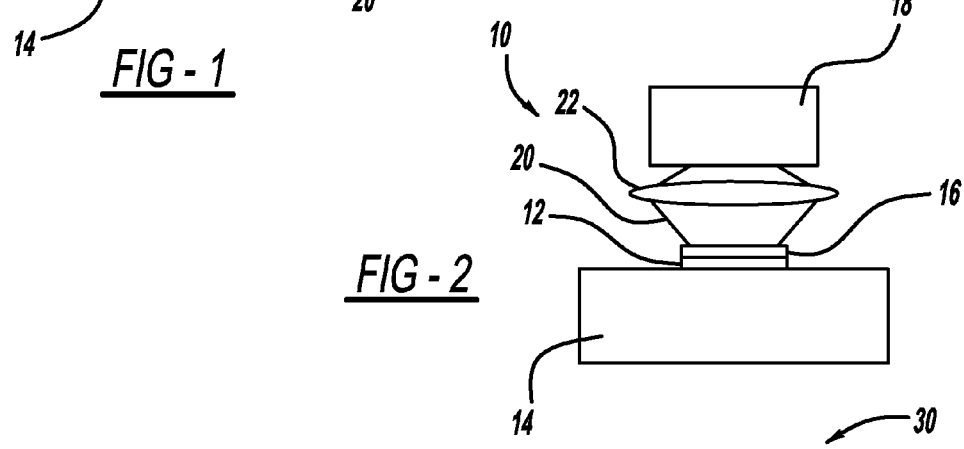
FIG. 2 is an end view of the semiconductor waveguide amplifier shown in FIG. 1.

FIG. 1 is a side view and FIG. 2 is an end view of a scalable semiconductor waveguide amplifier 10 of the type described above. The amplifier 10 includes a semiconductor waveguide 12 through which the optical signal propagates and a heat sink 14 mounted to one surface of the waveguide 12. A series of quantum well layers 16 are fabricated on a top surface of the waveguide 12. A series of optical pump sources 18, such as diode lasers, generate pump beams 20 that are imaged by a lens 22 into the quantum well layers 16 to provide the optical pumping.

The waveguide amplifier 10 provides good mode control within the waveguide 12 that allows the output beam to be highly coherent and be able to be focused to a small spot with good beam quality. However, because the waveguide 12 is pumped from the top by the pump sources 18, the pump beams 20 are directed into the thinnest dimension of the waveguide 12. This reduced the ability of the quantum well layers 16 and the waveguide 12 to absorb the pump light, which resulted in a lower output power.

The present disclosure proposes an edge photo-pumped semiconductor slab amplifier that includes a gain structure, such as a resonate periodic gain (RPG) structure, on upper and lower surfaces of the semiconductor slab. The structure allows photo-pumping from one or both of the side edges and one or both of the end edges of the slab with a conventional zig-zag path from end-to-end for the signal beam. The semiconductor slab amplifier enables high output beam power and good beam quality by providing a large gain volume, mode control within the gain volume and the ability to provide a lot of pump light into the gain volume, areas where known waveguide amplifiers are typically limited. Often, semiconductor waveguide optical amplifiers require relatively thin gain mediums to provide proper mode and phase control. Also, typical semiconductor waveguide optical amplifiers are typically pumped by means of electron injection, which limits the gain medium thickness to about 1 μm.

This design also results in the generation of heat almost exclusively at the top and bottom surfaces of the slab for very efficient heat transfer into an adjacent slab heat sink with virtually no temperature gradients within the slab to adversely impact the transmitted wavefront. Furthermore, a significant benefit of the semiconductor medium is that its thermal conductivity is several times greater than typical laser host crystals and the thermal conductivity of undoped semiconductor materials appropriate for photo-pumping is even greater than the n- or p-doped material used in electrically pumped diode laser devices.

Figure 3:
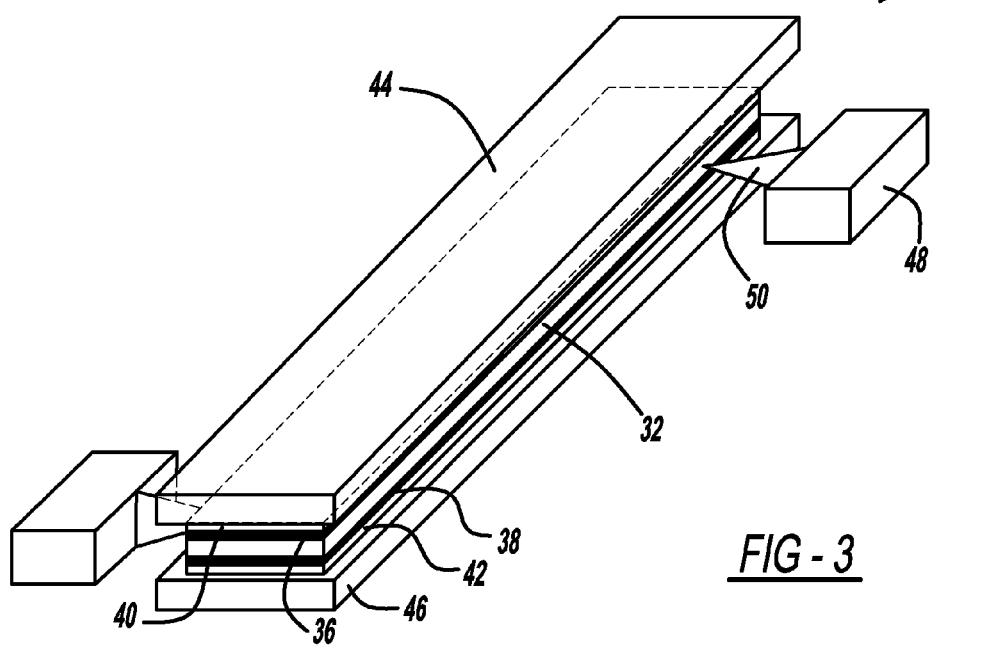
FIG. 3 is a perspective view of an edge photo-pumped semiconductor slab amplifier including RPG structures.
Figure 4:
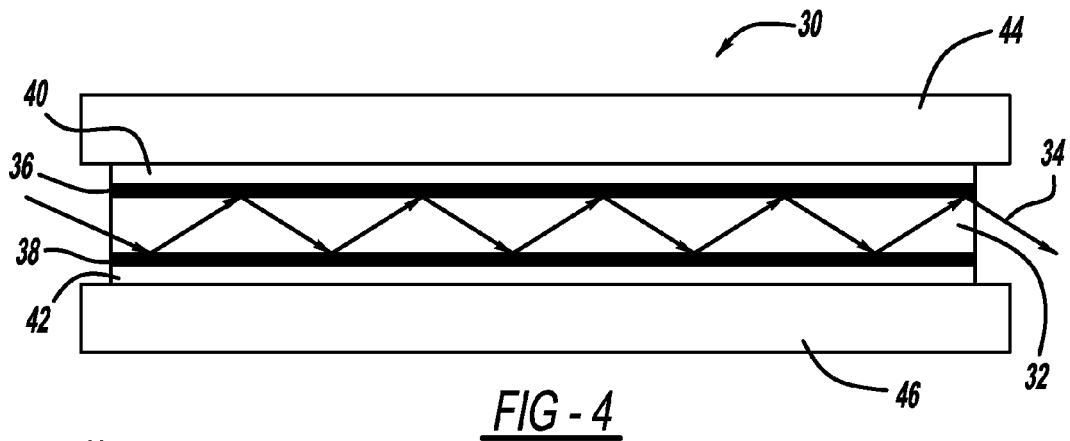
FIG. 4 is a side view of the semiconductor slab amplifier shown in FIG. 3.
Figure 5:
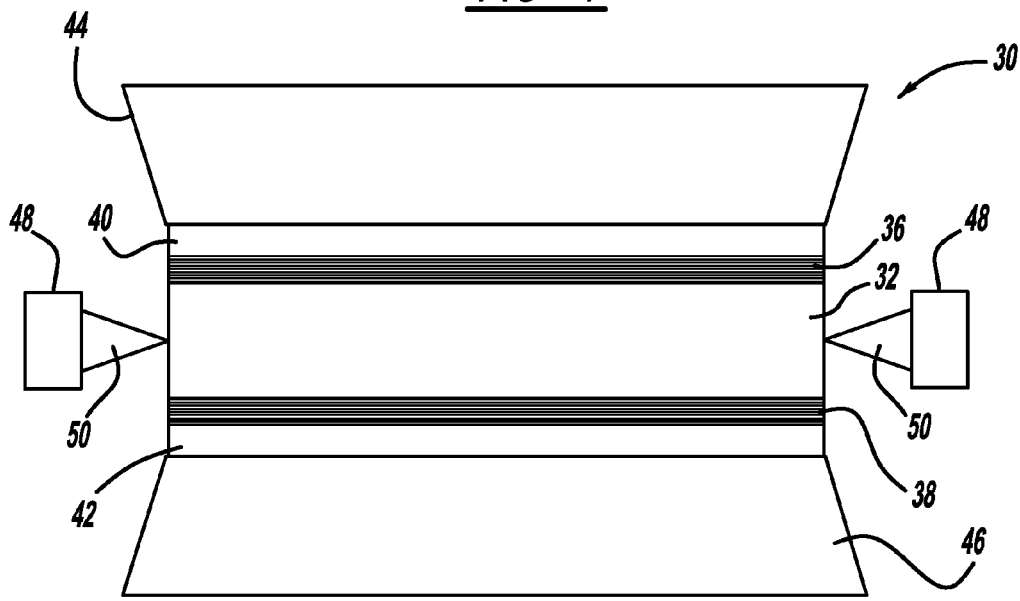
FIG. 5 is an end view of the semiconductor slab amplifier shown in FIG. 3.

FIG. 3 is a perspective view, FIG. 4 is a side view and FIG. 5 is an end view of an edge photo-pumped semiconductor slab amplifier 30. The amplifier 30 includes a semiconductor slab 32 through which a signal beam 34 propagates from one end of the slab 32 to an opposite end of the slab 32 by internal reflection or bounces. The semiconductor slab 32 is made of any suitable undoped semiconductor material, such as GaAs, InP, etc. Gain structures 36 and 38 are provided at upper and lower surfaces, respectively, of the semiconductor slab 32 that include stacked quantum well layers separated by interstitial layers. The gain structures 36 and 38 can be resonant periodic gain structures in one non-limiting embodiment to suppress parasitic lasing modes. However, other techniques can be employed to suppress parasitic lasing modes, such as etching away gain material and using implant isolation to render material to be non-amplifying. For a GaAs slab 32, the quantum well layers may be an alternating series of GaAs interstitial layers and InGaAs quantum well layers. The thickness of the interstitial layers can be made so that the quantum well gain layers provide resonant periodic gain. In this case, the interstitial layers would be greater than the thickness of the quantum well layers, where the thickness of the interstitial layers is determined by the bounce angle of the signal beam 34 and the thickness of the quantum well layers is determined by the wavelength of the signal beam 34 and by the band-gap of the quantum well material.

Lower index of refraction confining layers 40 and 42 are optically coupled to the gain structures 36 and 38, respectively, to confine the beam 34 in the slab 32. Suitable heat sink layers 44 and 46 are thermally coupled to the confining layers 40 and 42, respectively, and operate to draw away heat during the amplification process. In one non-limiting embodiment, the heat sink layers 44 and 46 are metal layers that are soldered to the confining layers 40 and 42 to provide the appropriate heat sink properties. An array of optical pump sources 48, such as laser diodes, are provided along the side edges of the slab 32 and each direct an optical pump beam 50 into the slab 32 to provide the light amplification in a manner that is well understood to those skilled in the art. A pump beam may also be directed through one or both of the end sides of the slab 32 in a co-propagating or counter-propagating geometry. This can be done using dichroic mirrors as one non-limiting example. Although a single optical pumping source 48 is shown at each side of the slab 32 in FIG. 3, it will be understood by those skilled in the art that optical pumping sources will be provided along the entire length of both sides of the slab 32 or through the end sides of the slab 32.

For the design of the slab amplifier 30, the length and thickness of the slab 32 are chosen to provide a discrete predetermined number of bounces for the signal beam 34 so as to effectively transfer the input aperture to the output aperture intact through the amplifier 30. This requires a fixed angle of incidence for the signal beam 34 at the upper and lower slab surfaces. Variations of such relay schemes are possible, as is common with zig-zag slab lasers. When the interstitial layers of the gain region are configured for periodic amplification, the gain structures 36 and 38 are designed for precisely that angle of incidence so as to amplify the signal beam 34 that bounces down the length of the slab 32 and relays the input aperture intact. The gain structures 36 and 38 enable photo-pumping from along the entire side surface of the slab 32 and very robust slab cooling, which does not lead to the very deleterious heating of these surfaces and the resulting wavefront degradation. The pump sources 48 can be diode bars that do not require collimating lenses for low power devices. However, this limits the pumping geometry to coupling single rows of bars along each edge of the slab 32. For a 50 mm×10 mm×1 mm slab, as many as a 100-200 diode bars could conceivably be edge coupled with collimating optics, enabling a very high output power. With good slab bonding, waste heat of as much as 5-10 kW could be dissipated. If an optical-to-optical efficiency as high as 80% were obtained, such a slab could emit an output power in excess of 20 kW.

As the signal beam 34 propagates down the slab 32 and bounces off the interface provided by the confining layers 40 and 42, a periodic intensity distribution is defined in the gain structures 36 and 38 as a result of the quantum well layers. As the pump light bounces between the side edges of the slab 32, energy from the pump light is transferred to and absorbed by the quantum wells. The bounce angle of the signal beam at the upper and lower interfaces defines the intensity distribution. The spacing of the quantum wells are matched to the intensity distribution pattern of the beam 34 in the gain structures 36 and 38 so that energy to the quantum wells is transferred to the signal beam 34. The nulls in the intensity distribution pattern are thus defined between the quantum wells and the anti-nodes of the intensity distribution are provided at the quantum wells so that a maximum interaction between the signal beam 34 is provided with the gain of the quantum wells. As a result of this interaction between the signal beam and the RPG structures 36 and 34, the heat generated by the amplifier 30 is generally confined to the upper and lower surfaces, and can be easily withdrawn by the heat sink layers 44 and 46. Thus, limited heat is generated at the center of the slab 32. Mode control can be provided for the slab amplifier 30 external of the slab 32 using mirrors, such as by Talbot self-imaging.

The process for producing an edge photo-pumped semiconductor slab amplifier starts with a semiconductor substrate used for the epitaxial growth of the gain structures 36 and 38. Since the substrate is incorporated into the slab 32, it must be of high purity with very low free carrier concentration and free from trap states that could absorb the signal beam 34. The width W and thickness d of the slab 32 are ultimately determined by the requirement to pump the gain structures 36 and 38 in the interior of the slab 32 and the output power desired. The ratio of W/d is typically 10:1 or less in a current slab design. The RPG structures 36 and 38 will typically consist of 10-30 quantum wells spaced at the correct spacing to correspond to the anti-nodes of the field as it reflects from the lower index of refraction confining layers 40 and 42. The maximum angle of incidence within the slab 32 is determined by the index of refraction difference between the confining layers 40 and 42 and the index of refraction of the slab 32. The critical angle $\theta_c$ for internal reflection is given by:

$$\theta_c = \sin^{-1}\left(\frac{n_c}{n_s}\right) \quad (1)$$

Where $n_c$ is the confining layer index of refraction and $n_s$ is the slab index or refraction.

Figure 6:
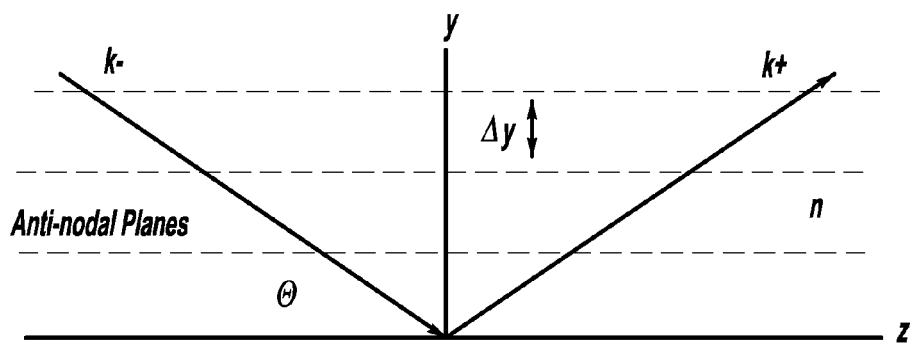
FIG. 6 is a graph showing the position of intensity maxima in a resonate periodic gain slab.

The confining layers 40 and 42 can be grown on the structure as the last layer, but could also be applied as a separate coating, such as $Al_2O_3$, after growth of the amplifier layers. For the slab thickness and length, there is an internal bounce angle that relays the input aperture to the output aperture, and the RPG structures 36 and 38 must be designed so that the anti-nodes of the field align with the quantum well positions. This is shown schematically in FIG. 6 where it is assumed that the internal bounce angle is $\theta$ with respect to the slab surface, as shown. Note that the index of refraction step to a cladding layer must be large enough so that the bounce angle $\theta$ is less than the critical angle $\theta_c$. The separation of the quantum wells $\Delta y$ is given by the following equations, which show that the spacing is narrower the steeper the bounce angle $\theta$.

$$I(y) = 4I_o\cos^2\left[\left(\frac{2\pi n}{\lambda_o}\sin\theta\right)y\right] = 2I_o\left[1 + \cos\left[\left(\frac{4\pi n}{\lambda_o}\sin\theta\right)y\right]\right] \quad (2)$$

$$\Delta y = \frac{\lambda_o}{2n\sin\theta} \quad (3)$$

Where I is the signal beam intensity, $\lambda_o$ is the wavelength of the signal beam and n is the index of refraction.

As a non-limiting example for a bounce angle of 10°, a wavelength of 1064 nm and an index of refraction of 3.5, the quantum well spacing would be about 872 nm and a stack of 30 quantum wells would be about 20 µm thick, which is within the limits of current epitaxial growth technology. If an AlGaAs confining layer of a few microns thick were grown on top of the RPG structures 36 and 38, the critical angle $\theta_c$ would be about 13.7°. However, if $Al_2O_3$ were used for the confining layers 40 and 42, the critical angle would be increased to 59°. Alternative films that would also work well to increase the critical angle $\theta_c$ if necessary could include ZnSe, which has also been grown on GaAs.

After the gain structures 36 and 38 and the confining layers 40 and 42 have been grown on one side of the slab 32, the slab 32 is removed from the epitaxial reactor and thinned by lapping to the thickness desired for the slab 32, such as 1 mm, and returned to the reactor for growth of an identical epitaxial layer structure on the opposite side from the initially grown layers. Upon removal from the reactor, the device is cut into the final lateral dimensions, such as 10 mm×50 mm, and the facing side surfaces of the slab 32 are polished. An anti-reflective (AR) coating for the pump wavelength can be applied to the thin sides of the slab 32 through which the pump light will be focused. The input slab angle faces and slab bounce angle θ could be designed for Brewster's angle or simply be AR coated without loss of generality.

The absorption coefficient of the material in the quantum wells is quite high at the wavelengths intermediate between the quantum well lasing wavelength and a shorter wavelength cut-off of the substrate and barrier material. To estimate how strongly lateral pump light is absorbed, it is noted that to the first order, the slab 32 resembles an inverted dual clad fiber, that is, there is a guiding structure with low loss and a thin region (quantum wells) that are strongly absorbing. In a dual clad fiber amplifier, it is customary to estimate the net pump absorption coefficient as the absorption coefficient of the doped core material times the area ratio of core-to-pump cladding. Following this procedure, the absorption coefficient $\alpha_{eff}$ for edge photo-pumping is approximately:

$$\alpha_{eff} = \alpha_{qw}\left(\frac{2Nd}{D}\right) \quad (4)$$

Where $\alpha_{qw}$ is the quantum well absorption coefficient, N is the number of quantum wells on each side, d is the quantum well thickness and D is the slab thickness.

For a quantum well absorption coefficient $\alpha_{qw}$ of 3000 $cm^{-1}$, d of 10 nm and D of 1 mm, the effective absorption coefficient $\alpha_{eff}$ is about 1.8 $cm^{-1}$, which is slightly higher than desirable for a 1 cm wide slab. The number or thickness of the quantum wells could be adjusted for the focus of the pump array coupling lens to distribute the pump intensity distribution across the slab width. Note that this pumping configuration is enabled by the use of transparent barrier and low loss substrate materials.

The gain for the gain structures 36 and 38 can also be estimated. To the first order, the net single pass gain would be the gain per bounce times the number of bounces the beam 34 makes off of the upper and lower surfaces in the interior of the slab 32. That bounce number could be 10-40 or more by design.

Quantum well material gain coefficients have been reported to be 1000 $cm^{-1}$, depending on carrier density. The unsaturated slab gain can be estimated by:

$$G_T = \exp\left[4Bg\frac{Nd}{\sin\theta}\right] \quad (5)$$

Where $G_T$ is the total single pass gain, B is the number of bounces, g is the quantum well gain coefficient, N is the number of quantum wells, d is the slab thickness and θ is the internal slab bounce angle.

This unsaturated gain can be quite large with strong photo-pumping, but will be reduced as the input signal is supplied to the amplifier 30 or a parasitic oscillation goes over a threshold. As an example, consider a 40 bounce slab with 30 quantum wells on each surface with a thickness of 10 nm, a sin θ of 0.25 and a quantum well gain coefficient of 500 $cm^{-1}$. Equation (5) gives an unsaturated single pass gain $G_T$ of 14765, which is physically unrealistic since parasitic oscillation would initiate at a much lower gain. The results are highly non-linear. For a quantum well gain coefficient reduced to 100 $cm^{-1}$, equation (5) predicts a $G_T$ of only 6.82 for that design.

The foregoing discussion discloses and describes merely exemplary embodiments. One skilled in the art will readily recognize from such discussion, and from the accompanying drawings and claims, that various changes, modifications and variations can be made therein without departing from the spirit and scope of the disclosure as defined in the following claims.

What is claimed is:

1. A semiconductor slab amplifier comprising:
    an undoped semiconductor slab having a length, a width and a height where the width of the slab is greater than the height of the slab and the length of the slab is greater than the width of the slab, said semiconductor slab including opposing upper and lower surfaces separated by the height of the slab, opposing edge surfaces separated by the width of the slab and opposing end surfaces separated by the length of the slab;
    a first gain structure formed on the upper surface of the slab and a second gain structure formed on the lower surface of the slab, said first and second gain structures including a plurality of quantum well layers separated by interstitial layers; and
    at least one optical pump source emitting an optical pump beam through one of the edge surfaces of the slab, wherein an optical signal beam enters one of the end surfaces of the slab and propagates down the slab in a zig-zag manner to exit the other end surface of the slab where the signal beam is amplified by the quantum well layers as it propagates through the first and second gain structures.

2. The amplifier according to claim 1 further comprising a first confining layer coupled to the first gain structure opposite to the slab and a second confining layer coupled to the second gain structure opposite to the slab, where the first and second confining layers have a lower index of refraction than the index of refraction of the slab to confine the signal beam within the slab as is propagates therethrough.

3. The amplifier according to claim 2 further comprising heat sinks thermally coupled to the first and/or second confining layer, said heat sinks drawing heat from the slab generated by the amplifying process.

4. The amplifier according to claim 2 wherein the first and second confining layers are $Al_2O_3$ layers.

5. The amplifier according to claim 1 wherein the at least one pump source is a diode laser bar.

6. The amplifier according to claim 5 wherein the diode laser bar is a plurality of diode laser bars extending along both sides of the slab.

7. The amplifier according to claim 6 wherein the number of diode laser bars is between 100 and 200 diode laser bars.

8. The amplifier according to claim 1 wherein the slab has a length of 50 mm, a width of 10 mm and a height of 1 mm.

9. The amplifier according to claim 1 wherein the first and second gain structures include between 10 and 30 quantum well layers.

10. The amplifier according to claim 1 wherein the gain structures are epitaxially grown on the semiconductor slab.

11. The amplifier according to claim 1 wherein the semiconductor slab is AlGaAs.

12. The amplifier according to claim 1 wherein the semiconductor slab includes an antireflective coating on the edge surfaces.

13. The amplifier according to claim 1 wherein the first and second gain structures are periodic resonant gain structures.

14. The amplifier according to claim 1 wherein the opposing end surfaces are Brewster angle cut.

15. A semiconductor slab amplifier comprising:
   a semiconductor slab having a length, a width and a height, said semiconductor slab including opposing upper and lower surfaces separated by the height of the slab, opposing edge surfaces separated by the width of the slab and opposing end surfaces separated by the length of the slab; and
   a first gain structure formed on the upper surface of the slab and a second gain structure formed on the lower surface of the slab, said first and second gain structures including a series of alternating interstitial layers and quantum well layers where the interstitial layers are thicker than the quantum well layers, where the quantum well layers provide optical gain for an optical signal beam that enters one of the end surfaces of the slab and propagates down the slab in a zig-zag manner to exit the other end surface of the slab.

16. The amplifier according to claim 15 further comprising optical pump sources positioned along the length of the slab and emitting optical pump beams through the edge surfaces of the slab, said optical pump beams providing optical energy for the quantum well layers.

17. The amplifier according to claim 15 further comprising a first confining layer coupled to the first gain structure opposite to the slab and a second confining layer coupled to the second gain structure opposite to the slab where the first and second confining layers have a lower index of refraction than the index of refraction of the slab to confine the signal beam within the slab as is propagates therethrough.

18. The amplifier according to claim 15 wherein the first and second gain structures are periodic resonant gain structures.

19. The amplifier according to claim 15 wherein the first and second gain structures include between 10 and 30 quantum well layers.

20. A semiconductor slab amplifier comprising:
   an undoped semiconductor slab having a length, a width and a height, where the width of the slab is greater than the height of the slab and the length of the slab is greater than the width of the slab, said semiconductor slab including opposing upper and lower surfaces separated by the height of the slab, opposing edge surfaces separated by the width of the slab and opposing end surfaces separated by the length of the slab;
   a first resonant periodic gain structure formed on the upper surface of the slab and a second resonant periodic gain structure formed on the lower surface of the slab, said first and second resonant periodic gain structures including an alternating series of interstitial layers and quantum well layers;
   a first confining layer coupled to the first resonant periodic gain structure opposite to the slab and a second confining layer coupled to the second resonant periodic gain structure opposite to the slab where the first and second confining layers have a lower index of refraction than the index of refraction of the slab;
   a first heat sink thermally coupled to the first confining layer and a second heat sink thermally coupled to the second confining layer; and
   a plurality of diode lasers extending along both sides of the slab each emitting an optical pump beam through one of the edge surfaces of the slab, wherein an optical signal beam enters one of the end surface of the slab and propagates down the slab in a zig-zag manner that provides beam bounces at the interface between the confining layers and the resonant periodic gain structures to exit the other end surface of the slab where the signal beam is amplified by the quantum well layers as it propagates through the first and second resonant periodic gain structures and the quantum well layers receive optical energy from the optical pump beams.

* * * * *